United States Patent [19]

Okitaka

[11] Patent Number: 5,075,577

[45] Date of Patent: Dec. 24, 1991

[54] TRISTATE OUTPUT CIRCUIT WITH INPUT PROTECTION

[75] Inventor: Takenori Okitaka, Hyogo, Japan

[73] Assignee: Mitsubishi Denki Kabushiki Kaisha, Tokyo, Japan

[21] Appl. No.: 208,227

[22] Filed: Jun. 17, 1988

[30] Foreign Application Priority Data

Jun. 23, 1987 [JP] Japan .................. 62-157064

[51] Int. Cl.⁵ .................. H03K 19/00; H03K 17/16
[52] U.S. Cl. .................. 307/473; 307/443
[58] Field of Search .................. 307/473, 475, 443

[56] References Cited

U.S. PATENT DOCUMENTS

| | | | |
|---|---|---|---|
| 4,280,065 | 7/1981 | Minato et al. | 307/473 |
| 4,350,906 | 9/1982 | Gillberg | 307/443 |
| 4,678,940 | 7/1987 | Vasseghi et al. | 307/473 |
| 4,703,203 | 10/1987 | Gallup et al. | 307/473 |
| 4,725,982 | 2/1988 | Hara et al. | 307/473 |
| 4,730,132 | 3/1988 | Watanabe et al. | 307/475 |
| 4,798,983 | 1/1989 | Mori | 307/570 |
| 4,837,462 | 6/1989 | Watanabe et al. | 307/446 |
| 4,851,721 | 7/1989 | Okitaka | 307/571 |
| 4,950,925 | 8/1990 | Doi et al. | 307/446 |

FOREIGN PATENT DOCUMENTS

| | | |
|---|---|---|
| 058958 | 9/1982 | European Pat. Off. . |
| 080929 | 5/1983 | Japan . |
| 0068718 | 4/1985 | Japan . |

OTHER PUBLICATIONS

"Tri-State Driver Utilizing Bipolar-Complementary Metal-Oxide Semiconductor Technology", by Kraft et al., IBM Technical Disclosure Bulletin, vol. 16, No. 8, Jan. 1974.

RCA Solid State: "QMOS Integrated Circuits", RCA Corporation; 1985; p. 469.

*Primary Examiner*—Edward P. Westin
*Assistant Examiner*—Richard Roseen
*Attorney, Agent, or Firm*—Lowe, Price, LeBlanc & Becker

[57] ABSTRACT

An NPN type bipolar transistor is connected between a first connection terminal for power supply voltage and an output terminal and its base is connected to an output of an inverter as a first internal circuit. An N channel MOS transistor is connected between the output terminal and a second connection terminal for ground potential and its gate is connected to an output of a second internal circuit. On the other hand, another N channel MOS transistor is connected between an input terminal and the second connection terminal and its gate is connected to the second connection terminal. An inverter as a third internal circuit is connected between the input terminal and the second internal circuit. The first and second connection terminals are connected to each of the first, second and third internal circuits. The second internal circuit is further connected with a state control terminal for controlling an output of the output terminal.

16 Claims, 7 Drawing Sheets

TRISTATE OUTPUT CIRCUIT WITH INPUT PROTECTION

CROSS-REFERENCE TO RELATED, COPENDING APPLICATIONS

A related, copending application of relevance to the present application is the U.S. patent application Ser. No. 159,854 filed Feb. 24, 1988 entitled "Semiconductor Integrated Circuit" and assigned to the assignee of the present application.

Another related, copending application is the U.S. patent application Ser. No. 132,648 filed Dec. 8, 1987 entitled "Input Protecting Device for a Semiconductor Circuit Device" and assigned to the assignee of the present application.

BACKGROUND OF THE INVENTION

1. Field of the Invention

The present invention relates to semiconductor devices used as interface between individual systems and particularly to semiconductor devices having a 3-state output function.

2. Description of the Prior Art

Figure 1:
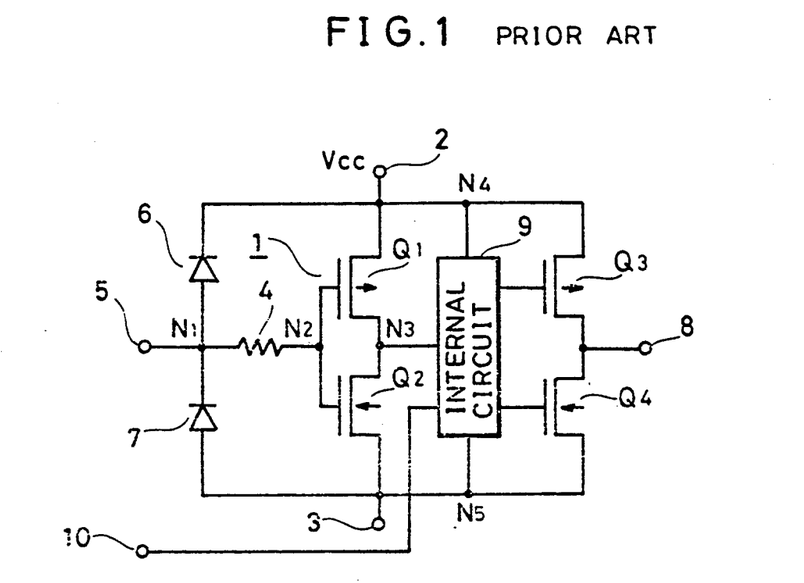
FIG. 1 is a circuit diagram showing input and output portions of a conventional semiconductor device having a 3-state output function using a CMOS circuit.

FIG. 1 is a circuit diagram showing input and output portions of a conventional semiconductor device having a 3-state output function, using a complementary metal-oxide semiconductor (CMOS) circuit.

Construction thereof will be described with reference to FIG. 1. An inverter 1 constituting the input portion comprises a P channel metal-oxide semiconductor (MOS) transistor Q1 and an N channel MOS transistor Q2 connected in series between a power supply terminal 2 as a first power supply for application of a power voltage Vcc of high potential and a ground terminal 3 as a second power supply. A node N2 as a common connection point of the gates of the two MOS transistors Q1 and Q2 is connected to a data input terminal 5 through an input protection resistance 4. Input protection diodes 6 and 7 for surge absorption are connected between a node N1 as a connection point of the data input terminal 5 and the protection resistance 4 and the power supply terminal 2, and between the node N1 and the ground terminal 3, respectively.

On the other hand, a P channel MOS transistor Q3 and and N channel MOS transistor Q4 constituting the output portion are connected in series between the power supply terminal 2 and the ground terminal 3, and a connection point of the MOS transistors Q3 and Q4 is used as an output terminal 8. An internal circuit 9 is provided between the input portion and the output portion. The internal circuit 9 has inputs connected to a node N3 of the transistors Q1 and Q2, a node N4 of an output enable terminal 10, the power supply terminal 2 and the transistor Q3, and a node N5 of the ground terminal 3 and the transistor Q4, respectively, while it has outputs connected to the respective gates of the transistors Q3 and Q4. Thus, the internal circuit 9 controls the MOS transistors Q3 and Q4 of the output portion based on an output signal of the inverter 1 and a signal applied to the output enable terminal 10. Concrete examples of construction of the internal circuit 9 are shown in FIGS. 2 and 3.

Figure 2:
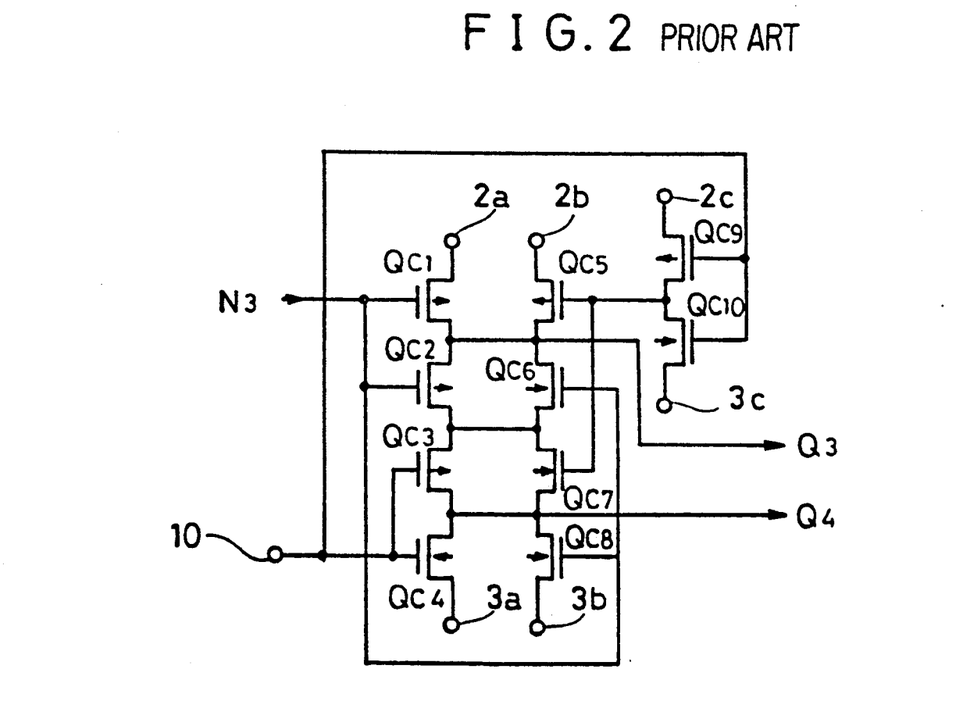
FIG. 2 is a diagram showing a concrete configuration of an internal circuit for use in a conventional device and an embodiment of the present invention.
Figure 3:
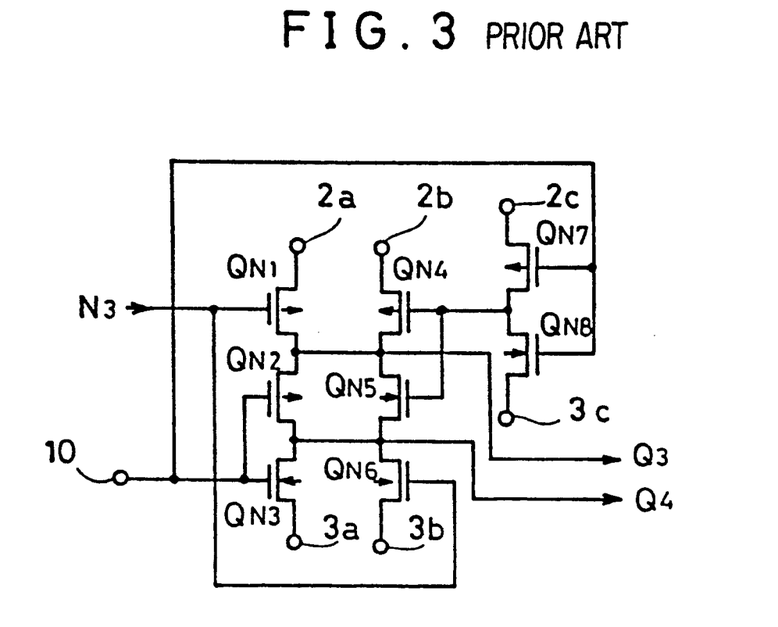
FIG. 3 is a diagram showing another concrete configuration of an internal circuit for use in the conventional device and the embodiment of the present invention.

Referring to FIG. 2, P channel MOS transistors Qc1, Qc2 and Qc3 and an N channel MOS transistor Qc4 are connected in series between a terminal 2a connected to the node N4 shown in FIG. 1 and a terminal 3a connected to the node N5 shown in FIG. 1. A P channel MOS transistor Qc5 and N channel MOS transistors Qc6, Qc7 and Qc8 are connected in series between a terminal 2b connected to the node N4 and a terminal 3b connected to the node N5. A P channel MOS transistor Qc9 and an N channel MOS transistor Qc10 are connected in series between a terminal 2c connected to the node N4 and a terminal 3c connected to the node N5. The node N3 is connected to the respective gates of the transistors Qc1, Qc2, Qc6 and Qc8, and the output enable terminal 10 is connected to the respective gates of the transistors Qc3, Qc4, Qc9 and Qc10. A connection point of the transistors Qc1 and Qc2 and a connection point of the transistors Qc5 and Qc6 are connected to constitute an output connected to the transistor Q3. A connection point of the transistors Qc3 and Qc4 and a connection point of the transistors Qc7 and Qc8 are connected to constitute the other output connected to the transistor Q4. A connection point of the transistors Qc2 and Qc3 and a connection point of the transistors Qc6 and Qc7 are connected. The gate of the transistor Qc5 and a connection point of the transistors Qc9 and Qc10 are connected to the gate of the transistor Qc7.

Operation of the internal circuit thus constructed will be briefly described. Let us assume an example in which a signal of high level (referred to hereinafter as H level) is applied as an output of the node N3, that is, the inverter 1, and an enable signal [a signal of low level (referred to hereinafter as L level)] is applied from the output enable terminal 10. The transistor Qc8 is turned on and the output to be supplied to the transistor Q4 changes to L level through conduction in the terminal 3b connected to the ground terminal. L level of the enable signal changes to H level through the transistors Qc9 and Qc10 of the inverter. As a result, the transistor Qc7 is turned on, while the transistor Qc5 is turned off. Since the transistor Qc6 is turned on upon receipt of the H level signal of the node N3, the transistors Qc6, Qc7 and Qc8 are all turned on and the output to be supplied to the transistor Q3 is transmitted through the terminal 3b and falls to L level.

When the L level signal is applied to the node N3 and the enable signal falls to L level, the outputs to be supplied to the transistors Q3 and Q4 all become the H level signals. On the other hand, when the enable signal rises to H level, the output signal to be supplied to the transistor Q3 rises to H level and the output signal to be supplied to the transistor Q4 falls to L level irrespective of the signal level at the node N3.

Referring to FIG. 3, construction of the internal circuit is the same as in FIG. 2, except that the transistors Qc2 and Qc6 in FIG. 2 are not provided. Relations among the signal at the node N3, the enable signal and the output signals are entirely the same as in FIG. 2.

Needless to say, constructions different from the above described constructions of the internal circuit may be also applied to the semiconductor device shown in FIG. 1 insofar as output signals are controlled as described above.

The input and output portions of the conventional semiconductor device having the 3-state output function are constructed as described above. If a signal of a predetermined level (L level) is applied to the output enable terminal 10 to bring the output portion into an enabled state, a signal dependent on the signal applied to the data input terminal 5 is obtained at the output terminal 8. For example, if the signal of L level is applied to the data input terminal 5, the output of H level is obtained from the inverter 1 and it is received by the internal circuit 9, so that a gate voltage of L level is applied therefrom to the MOS transistors Q3 and Q4 of the output portion. As a result, the MOS transistor Q3 is turned on and the MOS transistor Q4 is turned off, whereby the signal of H level is outputted at the output terminal 8. On the other hand, if the signal of H level is applied to the data input terminal 5, the output of the inverter 1 is of L level and upon receipt of the output, the internal circuit 9 applies a gate voltage of H level to the MOS transistors Q3 and Q4 of the output portion. As a result, the MOS transistor Q3 is turned off and the MOS transistor Q4 is turned on, whereby the signal of L level is outputted at the output terminal 8.

On the other hand, when the signal level applied to the output enable terminal 10 is changed to H level, the output portion is brought into a disabled state. More specifically, the gate voltage of H level is applied from the internal circuit 9 to the MOS transistor Q3 and the gate voltage of L level is applied from the internal circuit 9 to the MOS transistor Q4 as described above. As a result, the MOS transistors Q3 and Q4 are both turned off and the output terminal 8 is brought into a high-impedance state.

As described above, three kinds of output states appear at the output terminal 8 and those states are controlled according to operation timing in systems connected thereto.

The conventional semiconductor device having the 3-state output function uses the P channel MOS transistor Q3 and the N channel MOS transistor Q4 in the output portion as described above.

Figure 4:
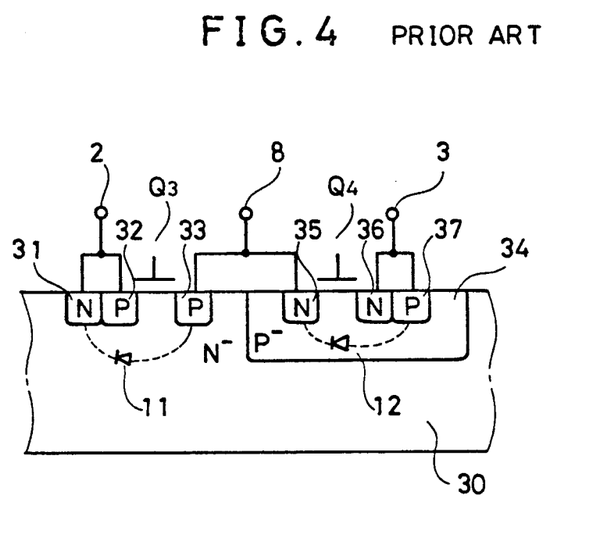
FIG. 4 is a schematic sectional view showing the output portion in FIG. 1, where parasitic diodes are generated in the transistors Q3 and Q4.

FIG. 4 is a schematic sectional view showing the output portion. As shown, P type impurity regions 32 and 33 to be drain and source regions of the transistor Q3 are formed on a major surface of an N⁻ type semiconductor substrate 30, the impurity region 32 to be the source region being connected with the power supply terminal 2. The power supply terminal 2 is also connected with an N type impurity region 31 formed on the major surface of the semiconductor substrate 30 to apply the power supply voltage to the substrate. Further, a P⁻ type well 34 is formed on the major surface of the semiconductor substrate 30 and N type impurity regions 35 and 36 to be drain and source regions of the transistor Q4 and a P type impurity region 37 to be a grounding contact of the well 34 are formed on the major surface of the well 34. The ground terminal 3 is connected to the impurity regions 36 and 37 and the output terminal 8 is connected to the impurity regions 33 and 35. In the above described structure, parasitic diodes 11 and 12 are formed between the output terminal 8 and the power supply terminal 2 and between the output terminal 8 and the ground terminal 3, respectively.

Figure 5:
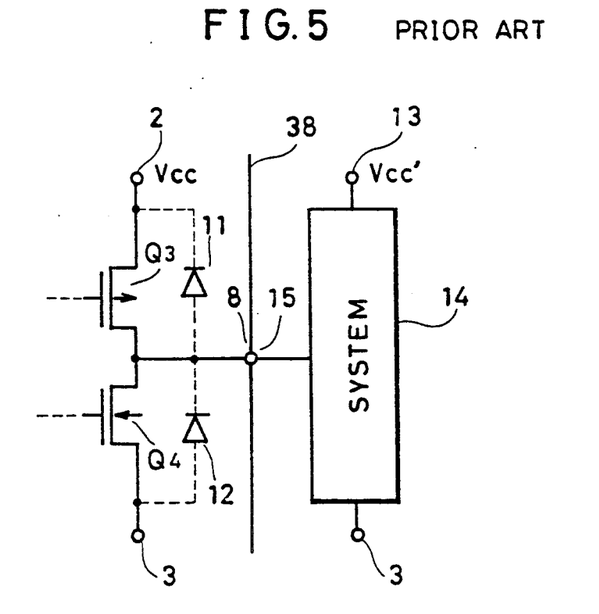
FIG. 5 is a circuit diagram in which another system is connected to the output portion of FIG. 1.

FIG. 5 is a circuit diagram in which the output portion of FIG. 1 is connected to another system.

As shown, the output terminal 8 of the semiconductor device having the 3-state output function is connected with an output terminal 15 of the system 14 having a power supply terminal 13 to which another power supply voltage Vcc' is supplied. In this case, when the supply of power to the semiconductor device having the 3-state output function is stopped to keep the device in the high-impedance state and only the system 14 is operated. Then, the output terminal 15 of the system 14 attains H level and electric current flows to the power supply terminal 2 through the parasitic diode 11.

As a result, the power supply terminal 2 rises to H level to bring about a state as if the power supply voltage stopped were applied to the power supply terminal 2. In consequence, this voltage might be applied to the internal circuit 9, causing the transistor Q4 to be turned on or erroneous operation to occur making it difficult to keep the high-impedance state of the device.

Figure 6:
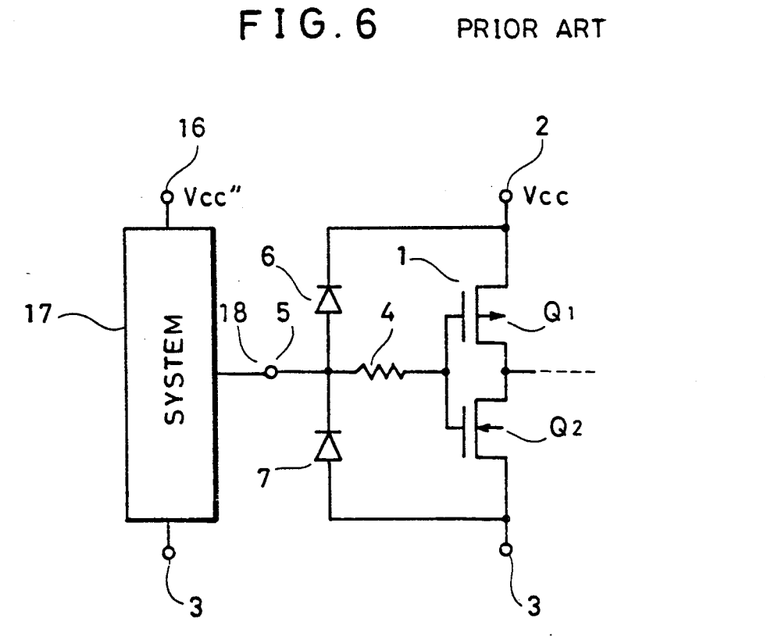
FIG. 6 is a circuit diagram in which another system is connected to the input portion of FIG. 1.

FIG. 6 is a circuit diagram in which the input portion of FIG. 1 is connected with another system.

Referring to FIG. 6, the data input terminal 5 of the semiconductor device having the 3-state output function is connected with an output terminal 18 of the system 17 having a power supply terminal 16 to which another power supply voltage Vcc" is supplied. In this case, when the supply of power to the semiconductor device having the 3-state output function is stopped and only the system 17 is operated, the output terminal 18 of the system 17 attains H level and electric current flows to the power supply terminal 2 through the input protection diode 6. As a result, the level of the power supply terminal 2 is raised to H level and erroneous operation might occur in the semiconductor device having the 3-state output function. Although this problem will be solved on the input side if the input protection diode 6 is removed, such solution involves another disadvantage that input electrostatic dielectric strength is considerably lowered.

A gate protection circuit using an input clamp diode is disclosed in page 469 of QMOS DATA BOOK BY RCA SOLID STATE. However, this document does not suggest any formation of a semiconductor device having high electrostatic dielectric strength without a path to a high-potential power supply as provided according to the present invention and it does not disclose any idea of such device either.

SUMMARY OF THE INVENTION

An object of the present invention is to provide a semiconductor device having a 3-state output function with high reliability on its output side.

The another object of the present invention is to provide a semiconductor device having a 3-state output function not affected by operation of another system connected to its output terminal.

The still another object of the present invention is to provide a semiconductor device having a 3-state output function not provided with a path of electric current from another system connected to its output terminal to a terminal to which power supply voltage is applied.

In order to accomplish the above described objects, the semiconductor device according to the present invention comprises a first connection terminal connected to a power supply potential, a second connection terminal connected to a ground potential, an input terminal, an output terminal and a state control terminal, and it further comprises a semiconductor control element. The semiconductor control element is connected between the first connection terminal and the output terminal and it is conducted when a potential applied thereto exceeds a predetermined potential. On the other hand, when the potential applied to the semiconductor control element is equal to or lower than the predetermined potential and a potential of the output terminal is higher than that of the first connection terminal, the semiconductor control element prohibits conduction between the output terminal and the first connection terminal.

In the semiconductor device thus constructed, the potential of the first connection terminal is not affected by a voltage of another system connected to the output terminal and accordingly erroneous operation never occurs.

Yet another object of the present invention is to provide a semiconductor device having a 3-state output function with high reliability on its input side.

Yet still another object of the present invention is to provide a semiconductor device having a 3-state output function not provided with a path of electric current from another system connected to its input terminal to a terminal to which power supply voltage is applied.

In order to accomplish the above-mentioned objects, the semiconductor device according to the present invention comprises a first connection terminal connected to a power supply potential, a second connection terminal connected to a ground potential, an input terminal, an output terminal, and a state control terminal, and it further comprises a semiconductor control element. The semiconductor control element is connected between the input terminal and the second connection terminal and it is conducted when a potential of the input terminal is lower than that of the second connection terminal. On the other hand, the semiconductor control element is conducted when the potential of the input terminal is equal to or higher than the potential of the second connection terminal by more than a predetermined potential.

In the semiconductor device thus constructed, a potential of the first connection terminal is not affected by a voltage of another system connected to the input terminal and accordingly erroneous operation never occurs.

Further object of the present invention is to provide a semiconductor device having a 3-state output function with high reliability.

Still further object of the present invention is to provide a semiconductor device having a 3-state output function not provided with a path of electric current from another system connected to its input terminal or output terminal to a terminal to which a power supply voltage is applied.

In order to accomplish the above-mentioned objects, the semiconductor device according to the present invention comprises a first connection terminal connected to a power supply potential, a second connection terminal connected to a ground potential, an input terminal, an output terminal and a state control terminal, and it further comprises a first semiconductor control element and a second semiconductor control element. The first semiconductor control element is connected between the first connection terminal and the output terminal and it is conducted when a potential applied thereto exceeds a first predetermined potential. On the other hand, when the potential applied to the first semiconductor control element is equal to or lower than the first predetermined potential and a potential of the output terminal is higher than that of the first connection terminal, the first semiconductor control element prohibits conduction between the output terminal and the first connection terminal. The second semiconductor control element is connected between the input terminal and the second connection terminal and it is conducted when a potential of the input terminal is lower than that of the second connection terminal. On the other hand, when the potential of the input terminal is equal to or higher than that of the second connection terminal by more than a second predetermined potential, the second semiconductor control element is conducted.

In the semiconductor device thus constructed, the potential of the first connection terminal is not affected by a voltage of another system connected to the input terminal or the output terminal and accordingly erroneous operation never occurs.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 7:
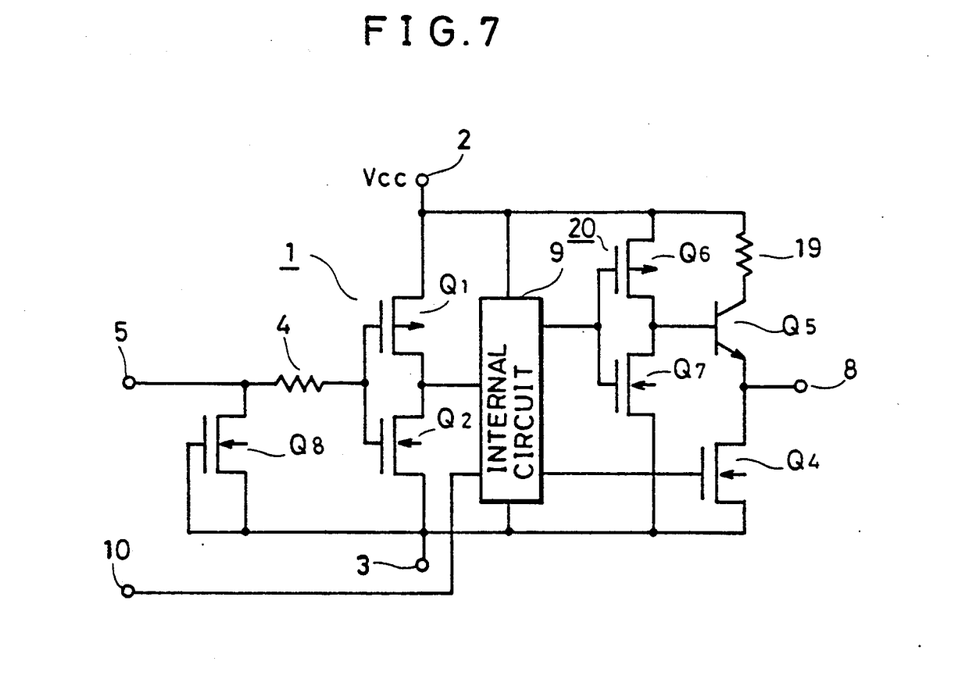
FIG. 7 is a circuit diagram showing input and output portions of a semiconductor device having a 3-state output function according to an embodiment of the present invention.

FIG. 7 is a circuit diagram showing input and output portions of a semiconductor device having a 3-state output function according to an embodiment of the present invention.

Construction thereof will be described in the following with reference to FIG. 7. A data input terminal 5, an output terminal 8, an output enable terminal 10, a P channel MOS transistor Q1, an N channel MOS transistor Q2 and an N channel MOS transistor Q4 are the same as in the conventional semiconductor device shown in FIG. 1 and the configuration of FIG. 2 or FIG. 3 is also applicable to an internal circuit 9 of this device.

In this embodiment, an NPN bipolar transistor Q5, in place of the P channel MOS transistor Q3 in the conventional device, is connected in series with the MOS transistor Q4. The collector of the NPN bipolar transistor Q5 is connected to a power supply terminal 2 through a resistance 19 and a connection point of the emitter of the NPN bipolar transistor Q5 and the MOS transistor Q4 is connected with the output terminal 8. An output terminal of the internal circuit 9 is connected to the base of the NPN bipolar transistor Q5 through an inverter 20 including a P channel MOS transistor Q6 and an N channel MOS transistor Q7.

On the other hand, the input protection diodes 6 and 7 for surge absorption as in the conventional device are not provided in the input portion and an N channel MOS transistor Q8 is provided instead between the data input terminal 5 and the ground terminal 3. The MOS transistor Q8 has its drain connected to the data input terminal 5 and its source and gate connected to the ground terminal 3.

In the semiconductor device having the 3-state output function as constructed above, when a predetermined signal level is applied to the output enable terminal 10 to bring the output portion into an enabled state, a signal dependent on a signal applied to the data input terminal 5 is provided from the output terminal 8. For example, when a signal of L level is applied to the data input terminal 5, the output of the inverter 1 rises to H level and, upon receipt of it, the internal circuit 9 applies a signal of L level to the inverter 20 in the succeeding stage and a signal of L level to the MOS transistor Q4 of the output portion. As a result, the signal of H level is outputted from the inverter 20 and the NPN bipolar transistor Q5 receiving this signal through its base is turned on. On the other hand, the MOS transistor Q4 receiving the gate voltage of L level is turned off. As a result, a signal of H level is outputted at the output terminal 8. Conversely, when a signal of H level is applied to the data input terminal 5, the output of the inverter 1 is caused to be L level and the internal circuit 9 receiving it applies a signal of H level to the inverter 20 in the succeeding stage and a signal of H level to the MOS transistor Q4. As a result, the signal of L level is outputted from the inverter 20 and the NPN bipolar transistor Q5 receiving this signal through its base is turned off. On the other hand, the MOS transistor Q4 receiving the gate voltage of H level is turned on. Thus, the signal of L level is outputted from the output terminal 8.

On the other hand, when the signal level applied to the output enable terminal 10 is changed to bring the output portion into a disabled state, the internal circuit 9 applies a signal of H level to the inverter 20 in the succeeding state and a signal of L level to the MOS transistor Q4. As a result, the signal of L level is outputted from the inverter 20 and the NPN bipolar transistor Q5 receiving this signal through its base is turned off. At the same time, the MOS transistor Q4 receiving the gate voltage of L level is also turned off and the output terminal 8 is brought into a high-impedance state.

As described above, generally in normal operation, the device performs the same function as in the conventional device.

Figure 8:
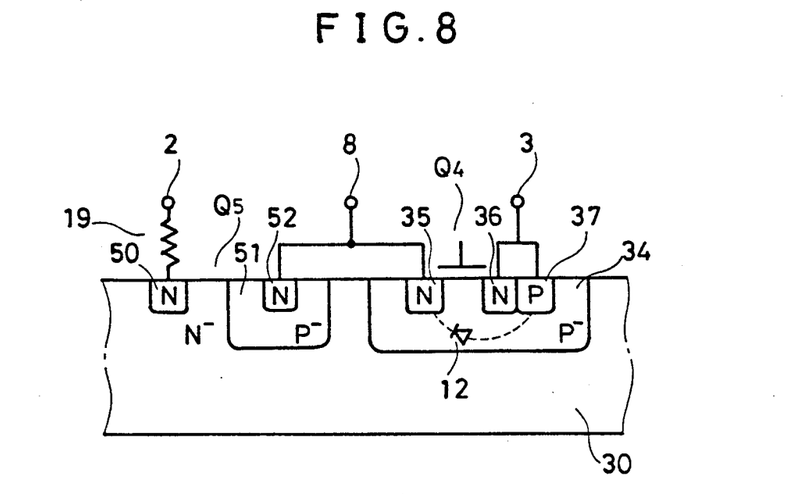
FIG. 8 is a schematic sectional view showing the output portion of FIG. 7, where a parasitic diode is generated only in the transistor Q4.

FIG. 8 is a schematic sectional view showing the output portion of FIG. 7.

In FIG. 8, the structure of the transistor Q4 is the same as the structure in the conventional device shown in FIG. 4. An N type impurity region 50 to be a collector region of the bipolar transistor Q5 is formed on a major surface of an N⁻ type semiconductor substrate 30 and this region 50 is connected to the power supply terminal 2 through the resistance 19. A P⁻ type well 51 to be a base region is formed on the major surface of the semiconductor substrate 30 and an N type impurity region 52 to be an emitter region is formed on a major surface of the well 51. The output terminal 8 is connected to the impurity regions 52 and 35.

In the above described structure, the NPN bipolar transistor Q5 is connected to the high-potential power supply of the output portion and accordingly a parasitic diode is not formed between the collector and the emitter of the NPN bipolar transistor Q5.

Figure 9:
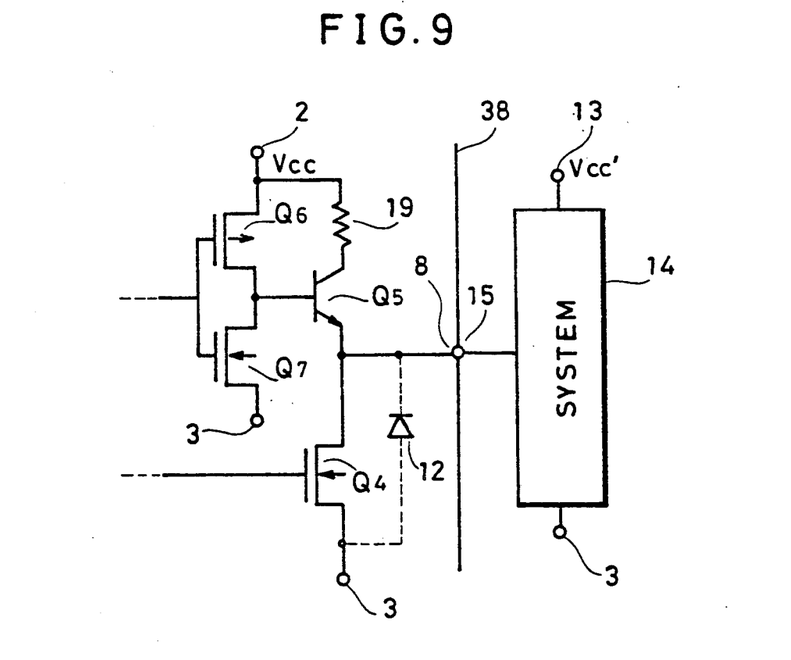
FIG. 9 is a circuit diagram in which another system is connected to the output portion of FIG. 7.

FIG. 9 is a circuit diagram in which another system is connected to the output portion of FIG. 7.

As shown in the figure, a bus line 38 is connected to the output terminal 8 of the semiconductor device having the 3-state output function, and an output terminal 15 of the system 14 having a power supply terminal 13 to which another power supply voltage Vcc' is applied. In this example, let us assume a case in which supply of power to the semiconductor device having the 3-state output function is stopped and only the system 14 is operated. Since there is no path of electric current to the power supply terminal 2, the level at the power supply terminal 2 is never raised to H level even if the output terminal 15 of the system 14 attains H level. Consequently, erroneous operation of the semiconductor device in the off state can be avoided and the high-impedance state is maintained.

Figure 10:
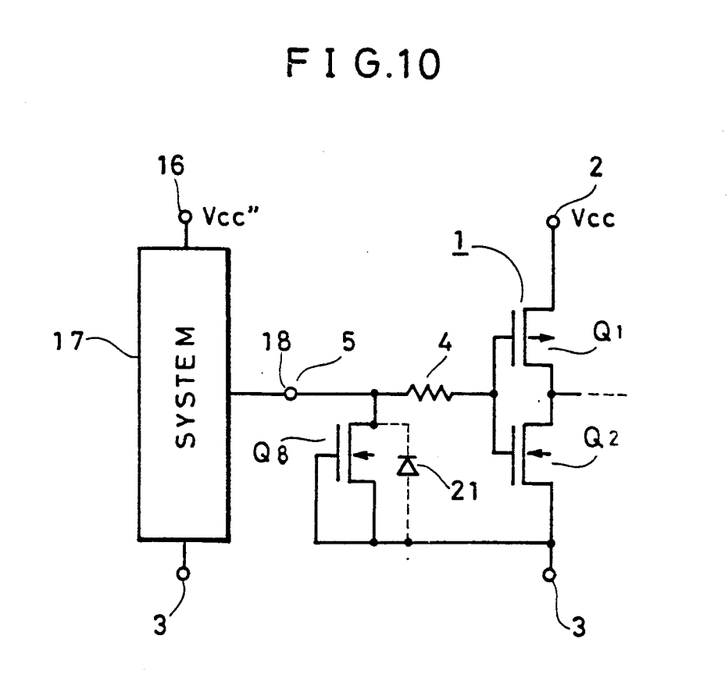
FIG. 10 is a circuit diagram in which another system is connected to the input portion of FIG. 7.

FIG. 10 is a circuit diagram in which another system is connected to the input portion of FIG. 7.

As shown in the figure, the data input terminal 5 of the semiconductor device having the 3-state output function is connected with an output terminal 18 of the system 17 having a power supply terminal 16 to which another power supply voltage Vcc'' is applied.

In this semiconductor device having the 3-state output function, the N channel MOS transistor Q8 is connected to the input portion and the ground terminal 3 is connected to the substrate region where the MOS transistor Q8 is formed in the same manner as in the case of the MOS transistor Q4 of FIG. 8. Accordingly, a parasitic diode 21 is formed between the drain of the MOS transistor Q8 and the ground terminal 3. In consequence, if a negative surge is applied to the data input terminal 5, a conduction path through the parasitic diode 21 is generated between the data input terminal 5 and the ground terminal 3 and the surge is absorbed through the conduction path. Thus, the parasitic diode 21 in this case performs the same function as that of the input protection diode 7 in the conventional device. On the other hand, if a positive surge is applied to the data input terminal 5, a drain depletion layer of the MOS transistor Q8 is enlarged because of the drain voltage (the surge voltage) and it overlaps with the depletion layer of the source, which causes electrons to be directly injected from the source to the depletion layer and to be moved into the drain. Accordingly, electric current flows between the drain and the source of the transistor Q8 and the surge is absorbed. Thus, the MOS transistor Q8 itself has the same function as that of the input protection diodes 6 and 7 in the conventional device. Consequently, the above described function of the MOS transistor Q8 makes it possible to give a high electrostatic dielectric strength in the input portion.

As a result, the input protection diode 6 as in the conventional device does not need to be connected between the data input terminal 5 and the power supply terminal 2. In the following, let us assume a case in which supply of power to the semiconductor device having the 3-state output function is stopped and only the system 17 is operated. Since there is no path for flow of electric current toward the power supply terminal 2, the level at the power supply terminal 2 is never raised to H level even if the level at the output terminal 18 of the system 17 becomes H level. Accordingly, the semiconductor device in the off state is never operated erroneously and the high-impedance state can be maintained.

Although in the above described embodiment the MOS transistor Q4 is used as a transistor connected to the low-potential power supply side in the output portion, a bipolar transistor may be used in place thereof.

As described in the foregoing, according to the present invention, the operational function of the device is never affected by a potential of another system connected to the input side or the output side in the high-impedance state and the semiconductor device has high reliability not involving any erroneous operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a tri-state output function, provided with a first connection terminal connected to a power supply potential, a second connection terminal connected to a ground potential, a device input terminal for receiving a data signal, and a device output terminal for supplying a data output signal, said semiconductor device comprising:
    a first semiconductor control element for inhibiting any flow of current from an external device connected to said device output terminal to said first connection terminal when said power supply potential is not applied, said semiconductor control element connected between said first connection terminal and said device output terminal, said semiconductor control element providing a data output signal at said device output terminal in response to an input signal applied to said device input terminal, said first semiconductor control element made conductive in response to a potential of a first signal applied to an input thereof exceeding a predetermined potential and inhibiting conduction between said output terminal and said first connection terminal in response to (a) a potential of said first signal applied thereto equal to or lower than said predetermined potential and (b) a potential of a signal applied to said device output terminal being higher than that of said power supply potential;
    a second semiconductor control element comprising an MOS transistor for applying a low logic level output potential to said device output terminal in response to said input signal applied to said device input terminal;
    a first internal circuit for generating a logic signal in response to said data input signal applied to said device input terminal; and
    second and third internal circuits, said second internal circuit generating an output signal in response to a signal supplied to an input terminal thereof and to an output enable signal applied to a state control terminal thereof,
    said second internal circuit connected to said first and second connection terminals and connected to supply said second internal circuit output signal to said first internal circuit, and
    said third internal circuit generating an output signal to said second internal circuit in response to said data input signal applied to said device input terminal and to said power supply potential, said third internal circuit connected to said first and second connection terminals and to said device input terminal for receiving said data input signal, wherein
    said first semiconductor control element is a bipolar transistor comprising a first conduction terminal connected to said first connection terminal, a control terminal connected to receive said logic signal from said first internal circuit, and a second conduction terminal connected to said output terminal.

2. A semiconductor device in accordance with claim 1, wherein
    said first and third internal circuits comprise inverter circuits.

3. A semiconductor device in accordance with claim 1 wherein
    said semiconductor device is formed on an N type semiconductor substrate, and
    said bipolar transistor is an NPN type transistor formed on said semiconductor substrate.

4. A semiconductor device having a tri-state output function, provided with a first connection terminal connected to a power supply potential, a second connection terminal connected to a ground potential, a device input terminal for receiving a data signal, and a device output terminal for supplying a data output signal, and a device enable terminal for receiving an output enable signal, said semiconductor device comprising:
    a first semiconductor control element for inhibiting any flow of current from an external device connected to said device input terminal to said second connection terminal when said power supply potential is not applied, said first semiconductor control element connected between said device input terminal and said second connection terminal, said first semiconductor control element being conductive in response to a potential of said data input signal applied to said device input terminal being lower than that of said ground potential applied at said second connection terminal, and conductive in response to a potential of said data input signal applied to said device input terminal is higher than that of said ground potential applied to said second connection terminal by more than a predetermined value; and
    second and third semiconductor control elements for applying high and low logic level output potentials, respectively, to said device output terminal in response to (i) said data input signal and (ii) said output enable signal, said second control element comprising an MOS transistor,
    said second and third semiconductor elements simultaneously inhibiting conduction in response to said output enable signal to present a high impedance tri-state output at said device output terminal.

5. A semiconductor device in accordance with claim 4, wherein
    said semiconductor control element is an MIS type transistor comprising a first conduction terminal connected to said input terminal, a second conduction terminal connected to said second connection terminal, and a control terminal connected to said second connection terminal.

6. A semiconductor device in accordance with claim 5, wherein
    said semiconductor device is formed on an N type semiconductor substrate having a major surface, and said MIS type transistor is an N channel type transistor formed in a P type well formed on the major surface of said semiconductor substrate.

7. A semiconductor device having a tri-state output function, provided with a first connection terminal connected to a power supply potential, a second connection terminal connected to a ground potential, a device input terminal for receiving a data signal, a device enable terminal for receiving an output enable signal, and a device output terminal for supplying a data output signal, said semiconductor device comprising:

a first semiconductor control element for inhibiting any flow of current from an external device connected to said device output terminal, said control element connected between said first connection terminal and said device output terminal, said first semiconductor control element providing a data output signal at said device output terminal in response to (i) an input signal applied to said device input terminal and (ii) said output enable signal, said first semiconductor control element made conductive in response to a potential of a first signal applied to an input thereof exceeding a predetermined potential and inhibiting conduction between said output terminal and said first connection terminal in response to (a) a potential of said first signal applied thereto being equal to or lower than said predetermined potential and (b) a potential of a signal applied to said device output terminal being higher than that of said power supply potential;

a second semiconductor control element for inhibiting any flow of current from an external device connected to said device input terminal, said second control element connected between said device input terminal and said second connection terminal, said second semiconductor control element being conductive in response to a potential of said data input signal applied to said device input terminal being lower than that of said ground potential applied at said second connection terminal, and conductive in response to a potential of said data input signal applied to said device input terminal being higher than that of said ground potential applied to said second connection terminal by more than a predetermined value; and a third semiconductor control element comprising an MOS transistor for providing a low impedance path between said output terminal and second connection terminal in response to (i) said data input signal and (ii) said output enable signal said first and third semiconductor control elements simultaneously inhibiting conduction in response to said output enable signal to present a high impedance tri-state output at said output terminal.

8. A semiconductor device in accordance with claim 7, wherein said semiconductor device further comprises a first internal circuit (20) for generating a logic signal in response to said data input signal applied to said device input terminal (5), and said first semiconductor control element (Q5) comprises a bipolar transistor including a first conduction terminal connected to said first connection terminal (2), a control terminal connected to receive said logic signal from said first internal circuit (20), and a second conduction terminal connected to said output terminal (8).

9. A semiconductor device is accordance with claim 8, wherein said bipolar transistor is an NPN type transistor formed on an N type semiconductor substrate.

10. A semiconductor device in accordance with claim 8, wherein said first semiconductor control element comprises a first resistance element connected between said first connection terminal and the first conduction terminal of said bipolar transistor.

11. A semiconductor device in accordance with claim 7, wherein said second semiconductor control element (Q8) is an MIS type transistor comprising a first conduction terminal connected to said device input terminal (5), a second conduction terminal connected to said second connection terminal (3), and a control terminal connected to said second connection terminal (3).

12. A semiconductor device in accordance with claim 11, wherein said semiconductor device is formed on an N type semiconductor substrate having a major surface, and said MIS type transistor is an N channel type transistor formed in a P type well formed on the major surface of said semiconductor substrate.

13. A semiconductor device having a tri-state output function, provided with a first connection terminal connected to a power supply potential, a second connection terminal connected to a ground potential, a device input terminal for receiving a data signal, and a device output terminal for supplying a data output signal, said semiconductor device comprising:

a first semiconductor control element for inhibiting any flow of current from an external device connected to said device output terminal, said control element connected between said first connection terminal and said device output terminal, said first semiconductor control element providing a data output signal at said device output terminal in response to an input signal applied to said device input terminal, said first semiconductor control element made conductive in response to a potential of a first signal applied to an input thereof exceeding a predetermined potential and inhibiting conduction between said output terminal and said first connection terminal in response to (a) a potential of said first signal applied thereto being equal to or lower than said predetermined potential and (b) a potential of a signal applied to said device output terminal being higher than that of said power supply potential;

a second semiconductor control element for inhibiting any flow of current from an external device connected to said device input terminal, said second control element connected between said device input terminal and said second connection terminal, said second semiconductor control element being conductive in response to a potential of said data input signal applied to said device input terminal being lower than that of said ground potential applied at said second connection terminal, and conductive in response to a potential of said data input signal applied to said device input terminal being higher than that of said ground potential applied to said second connection terminal by more than a predetermined value;

a third semiconductor control element comprising an MOS transistor for providing a low impedance path between said output terminal and second connection terminal in response to said data input signal;

a first internal circuit for generating a logic signal in response to said data input signal applied to said device input terminal, said first semiconductor control element comprising a bipolar transistor including a first conduction terminal connected to said first connection terminal, a control terminal connected to receive said logic signal from said first internal circuit, and a second conduction terminal connected to said output terminal; and second and third internal circuits, said second internal circuit generating first and second output signals in response to a signal supplied to an input terminal thereof and to an output enable signal applied to a state control terminal thereof, and a third semiconductor control element, said second internal circuit connected to said first and second connection terminals and connected to supply said first and second output signals respectively to said first internal circuit, and said third semiconductor control element, said second internal circuit responsive to a signal potential applied to said state control terminal for controlling said first internal circuit and said third semiconductor control element, said third internal circuit generating an output signal to said second internal circuit in response to said data input signal applied to said device input terminal and to said power supply potential, said third internal circuit connected to said first and second connection terminals and to said device input terminals for receiving said data input signal, and said third semiconductor control element being an MOS type transistor comprising a first conduction terminal connected to said device output terminal, a second conduction terminal being connected to said second connection terminal, and a control terminal being connected to said second internal circuit for receiving said second output signal from said second internal circuit.

14. A semiconductor device in accordance with claim 13, wherein said first internal circuit comprises a first inverter circuit, and said third internal circuit comprises a second inverter circuit.

15. A semiconductor device in accordance with claim 14, wherein said third internal circuit comprises a resistance element connected between said device input terminal and said second inverter circuit (1).

16. A semiconductor device including a tri-state output, comprising:

data input and output terminals;

a power supply terminal for receiving a power supply potential;

an input inverter receiving an input from said data input terminal and supplying an inverted data signal;

a switching circuit having an output enable input receiving an output enable signal and a data input receiving said inverted data signal and, in response to said output enable signal and to said inverted data signal, supplying a logic signal and a control signal at respective outputs thereof;

an output inverter receiving said logic signal as an input and supplying an inverted logic signal in response thereto at an output terminal;

a first bipolar type semiconductor control element for applying a high logic level output to said output terminal in response to said inverted logic signal and to a potential of said output terminal that is in a range between predetermined minimum and maximum voltage values whereby said first semiconductor control element inhibits a flow of current from an external device connected to said output terminal when said power supply potential is less than said minimum voltage value;

a second MOS type semiconductor control element for applying a ground potential to said data input terminal in response to a potential applied to said data input terminal that is less than said ground potential or greater than a predetermined value above said ground potential whereby said second semiconductor control element inhibits a flow of current from an external device connected to said input terminal when to said power supply potential is below a predetermined threshold potential; and a third semiconductor control element for applying a low logic level output potential to said output terminal in response to said switching circuit control signal said first and third semiconductor control elements responsive to said output enable signal for simultaneously inhibiting conduction in response to said output enable signal to present a high impedance tri-state output at said output terminal.

* * * * *